United States Patent [19]

Haville

[11] 4,359,688

[45] Nov. 16, 1982

[54] FREQUENCY MULTIPLYING CIRCUIT FOR AN OPTICAL ENCODER

[75] Inventor: George D. Haville, Little Rock, Ark.

[73] Assignee: BEI Electronics, Inc., Little Rock, Ark.

[21] Appl. No.: 202,166

[22] Filed: Oct. 30, 1980

[51] Int. Cl.³ .............................................. H03B 19/00
[52] U.S. Cl. ...................................... 328/20; 307/271
[58] Field of Search ................... 328/20, 15, 16, 38; 307/271

[56] References Cited

U.S. PATENT DOCUMENTS 4,052,626 10/1977 Tuma et al. ............................ 328/20

Primary Examiner—John S. Heyman
Attorney, Agent, or Firm—Burmeister, York, Palmatier, Hamby & Jones

[57] ABSTRACT

A frequency multiplying circuit for producing double frequency sine and cosine output signals sin 2x and cos 2x from sine and cosine input signals sin x and cos x, comprising two multiplier circuits, each having an output $e_0$ and four inputs $a_1$, $a_2$, $b_1$ and $b_2$ and being adapted to perform multiplication in accordance with the following relation:

$$e_0 = K(a_1 - a_2)(b_1 - b_2);$$

sine and cosine input amplifiers for supplying the sin x and cos x input signals; means for supplying the cos x input signal to the $a_1$ input of the first multiplier circuit; means for supplying the cos x signal to the $b_1$ input of the first multiplier circuit, means affording a gain of 2 in the first channel, relative to the second channel, means for supplying zero input to the $a_2$ and $b_2$ inputs of the first multiplier circuit; means for supplying the cos x input signal to the $a_1$ and $b_1$ inputs of the second multiplier circuit; a phase inverter for supplying a negative sin x input to the $a_2$ input of the second multiplier circuit; and means for supplying the sin x input signal to the $b_2$ input of the second multiplier circuit, whereby the first and second multiplier circuits develop output signals proportional to sin 2x and cos 2x, respectively.

10 Claims, 1 Drawing Figure

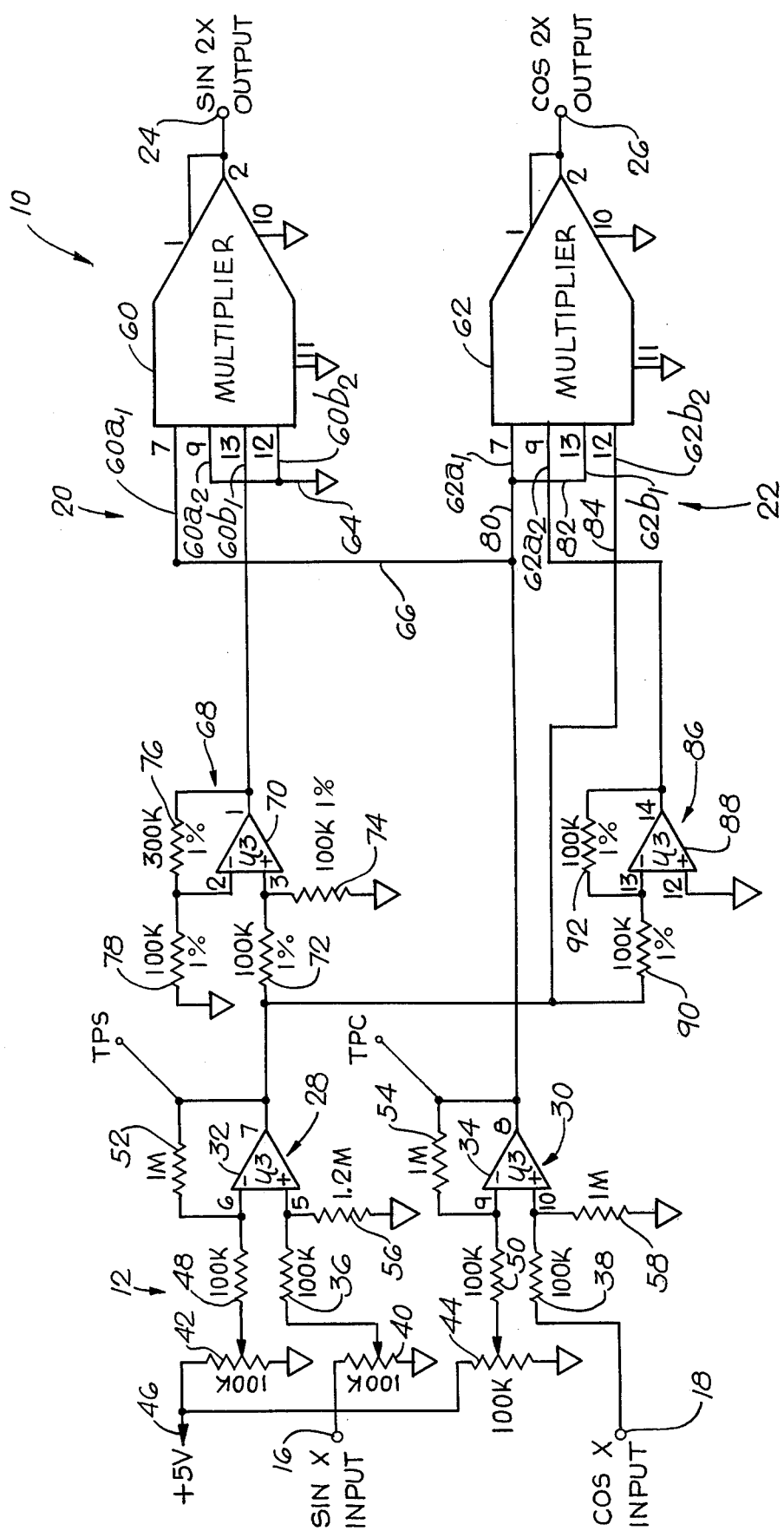

FREQUENCY MULTIPLYING CIRCUIT FOR AN OPTICAL ENCODER

BACKGROUND OF THE INVENTION

This invention relates to a frequency multiplying electrical circuit for producing double frequency sine and cosine output signals sin 2x and cos 2x from sine and cosine input signals sin x and cos x.

The invention is particularly well adapted for use in connection with an optical encoder for encoding the position of a rotatable shaft or some other movable member. Such an optical encoder often includes a rotatable code disc having a multiplicity of binary code tracks of successive orders, plus sine and cosine tracks of the next higher order. The tracks are adapted to be read by a reading head comprising one or more light sources and an array of photoelectric transducers or detectors. The reading head has a multiplicity of outputs, which produce digital signals constituting a binary word representing the position of the disc, plus sine and cosine or quadrature output signals which vary sinusoidally as a function of the position of the disc. Typically, the quadrature output signals are of a higher order than the digital output signals. For example, an optical encoder might have eleven binary tracks for producing an 11-bit digital output word, plus sine and cosine tracks of the twelfth order.

The general object of the present invention is to provide a new and improved frequency multiplying electrical circuit for producing double frequency sine and cosine output signals sin 2x and cos 2x from sine and cosine signals sin x and cos x, such as the quadrature output signals of an optical encoder.

The multiplying circuit of the present invention produces one additional output bit or digit, so that the position of the code disc is more precisely represented by the output signals from the optical encoder. Two or more of the multiplying circuits of the present invention may be cascaded to produce two or more additional bits or digits. Thus, for example, sin 4x and cos 4x signals may be produced from the sin 2x and the cos 2x signals. By using two cascaded multiplying circuits, the total number of output tracks can be effectively increased from twelve to fourteen, for example.

SUMMARY OF THE INVENTION

To achieve these and other objects, the present invention may provide a frequency multiplying electrical circuit for producing double frequency sine and cosine output signals sin 2x and cos 2x from sine and cosine input signals sin x and cos x, comprising sine input means and cosine input means for supplying the sin x and cos x input signals; a first channel including a first multiplier circuit having an output $e_0$ and inputs $a_1$ and $b_1$ and being adapted to perform multiplication in accordance with the following relation:

$$e_0 = K a_1 b_1;$$

the first channel including means connected between the cosine input means and the $a_1$ input of the first multiplier circuit for supplying the cos x input signal thereto; the first channel including means connected between the sine input means and the $b_1$ input of the first multiplier circuit for supplying a sin x signal thereto; and a second channel including a second multiplier circuit having an output $e_0$ and four inputs $a_1$, $a_2$, $b_1$ and $b_2$ and being adapted to perform multiplication in accordance with the following relation:

$$e_0 = K(a_1 - a_2)(b_1 - b_2);$$

the second channel including means connected between the cosine input means and the $a_1$ and $b_1$ inputs of the second multiplier circuit for supplying the cos x input signal to the $a_1$ and $b_1$ inputs of the second multiplier circuit; the second channel including phase inverting means connected between the sine input means and the $a_2$ input of the second multiplier circuit for supplying a negative sin x input to the $a_2$ input of the second multiplier circuit; the second channel including means connected between the sine input means and the $b_2$ input of the second multiplier circuit for supplying the sin x input signal to the $b_2$ input of the second multiplier circuit; and means affording a gain of 2 in the first channel relative to the second channel, whereby the first channel develops an output proportional to sin 2x, while the second channel develops an output proportional to cos 2x.

The gain of two may be afforded by an amplifier in the first channel. The sine input means and the cosine input means may comprise respective input amplifiers for supplying the sin x and cos x signals in amplified form. The amplifiers may include means for adjusting the relative gain of the amplifiers. Direct current offset adjusting means may also be provided.

BRIEF DESCRIPTION OF THE DRAWING

Further objects, advantages and features of the present invention will appear from the following description, taken with the accompanying drawing, in which the sole FIGURE comprises a schematic circuit diagram of a frequency multiplying circuit to be described as an illustrative embodiment of the present invention.

As just indicated, the drawing illustrates a frequency multiplying circuit 10 having sine and cosine input means 12 and 14 for receiving and supplying the sin x and cos x input signals from the optical encoder or the like. Thus, the sine and cosine input means 12 and 14 may have sin x and cos x input terminals 16 and 18, adapted to be connected to the sin x and cos x outputs of the optical encoder.

The frequency multiplying circuit 10 has first and second channels 20 and 22 for producing the double frequency output signals sin 2x and cos 2x from the input signals sin x and cos x. The channels 20 and 22 have sin 2x and cos 2x output terminals 24 and 26, adapted to serve as additional outputs for the optical encoder.

The sine and cosine input means 12 and 14 preferably include input amplifier circuits 28 and 30 for supplying the sin x and cos x input signals in amplified form. The illustrated amplifier circuits 28 and 30 utilize integrated operational amplifiers 32 and 34 with negative feedback to establish the gain of the amplifiers, the gain being established at ten or thereabouts in this case. It will be seen that the sin x and cos x input terminals 16 and 18 are connected to the noninverting inputs of the operational amplifiers 32 and 34 through input resistors 36 and 38. A gain control 40 is also provided in at least one of the input circuits. As illustrated, the gain control 40 is in the form of a potentiometer connected between the sin x input terminal 16 and the noninverting input of the operational amplifier 32. The gain control 40 may be employed to balance or equalize the amplified sin x and cos x input signals.

The input means 12 and 14 may also include direct current offset adjusting means, illustrated in the form of potentiometers 42 and 44 for supplying adjustable biasing voltages to the inverting inputs of the operational amplifiers 32 and 34. As shown, the potentiometers 42 and 44 are connected between a +5 volt bias supply terminal and the inverting inputs of the operational amplifiers 32 and 34, through input resistors 48 and 50. Negative feedback resistors 52 and 54 are connected between the outputs of the operational amplifiers 32 and 34 and the respective inverting inputs. Ground return resistors 56 and 58 are connected between ground and the noninverting inputs of the operational amplifiers 32 and 34.

As illustrated, the first and second channels 20 and 22 of the frequency multiplying circuit 10 include first and second multiplier circuits 60 and 62, which may be in the form of commercially available integrated circuits having their outputs connected to the sin 2x and cos 2x output terminals 24 and 26. In this case, each of the multiplier circuits 60 and 62 has four inputs, arranged in two differential pairs of inputs. Thus, the multiplier circuit 60 has four inputs $60a_1$, $60a_2$, $60b_1$ and $60b_2$. The multiplier circuit 62 has four inputs $62a_1$, $62a_2$, $62b_1$ and $62b_2$. Each of the multiplier circuits 60 and 62 is adapted to perform multiplication in accordance with the following relation between the output voltage $e_0$ and the input signals $a_1$, $a_2$, $b_1$, and $b_2$:

$$e_0 = K(a_1 - a_2)(b_1 - b_2);$$

in the case of the first multiplier circuit 60, the inputs $60a_2$ and $60b_2$ are connected to ground by a lead 64 so that the signal level at these inputs is always zero. The cos x input signal is supplied to the input $60a_1$, by simply connecting a lead 66 between the input $60a_1$ and the output of the input amplifier 34 for the cos x signal.

The input $60b_1$ of the multiplier circuit 60 is supplied with the sin x input signal. Moreover, a gain of two is introduced into the first channel 20. In this case, these functions are combined by connecting an amplifier 68, having a gain of 2, between the output of the sine input amplifier 32 and the multiplier input $60b_1$. However, the gain of 2 may be introduced anywhere in the first channel 20. The gain of 2 is a relative factor, in relation to the gain of the second channel 22.

As illustrated, the amplifier circuit 68 employs an integrated operational amplifier 70; an input resistor 72, connected between the output of the sine amplifier and the noninverting input of the amplifier 70; a ground return resistor 74, connected between ground and the noninverting input; a negative feedback resistor 76, connected between the output of the operational amplifier 70 and the inverting input; and an input resistor 78, connected between ground and the inverting input. The output of the amplifier 70 is connected to the multiplier input $60b_1$.

In the second channel 22, the cos x signal is supplied to the multiplier inputs $62a_1$ and $62b_1$ by leads 80 and 82, connected to the output of the cosine amplifier 34. The sine signal is supplied to the multiplier input $62b_2$ by a lead 84, connected to the output of the sine amplifier 32.

A negative sin x signal is supplied to the multiplier input $62a_2$ by means including a phase inverter 86, connected between the output of the amplifier 32 and the input $62a_2$. The illustrated phase inverter 86 employs an integrated operational amplifier 88 having negative feedback to provide unity gain. Thus, the output of the sine amplifier 32 is connected through an input resistor 90 to the inverting input of the operational amplifier 88. A negative feedback resistor 92 is connected between the output of the amplifier 88 and the inverting input. The noninverting input of the amplifier 88 is connected directly to ground. The output of the amplifier 88 is connected to the multiplier input $62a_2$.

OPERATION OF THE EMBODIMENTS

In the illustrated multiplying circuit 10, the sine and cosine input amplifiers 28 and 30 supply the sin x and cos x input signals in amplified form. In this case, the gain of the amplifiers 28 and 30 is such that the overall gain in each of the channels 20 and 22 is unity. However, some other level of overall gain could be provided, if desired. Thus, by way of example, the gain of the amplifiers 28 and 30 may be 10, to compensate for a loss factor of 10 in the multiplier circuits 60 and 62.

The frequency multiplying circuit 10 employs the following two trigonometric identities:

$$\sin 2x = 2 \sin x \cos x$$

$$\cos 2x = \cos^2 x - \sin^2 x$$

The second trigonometric identity may be factored to produce the following equivalent trigonometric identity:

$$\cos 2x = (\cos x + \sin x)(\cos x - \sin x)$$

As previously indicated, each of the multiplier circuits 60 and 62 may be in the form of a commercially available integrated circuit, adapted to perform multiplication in accordance with the following relation:

$$e_0 = K(a_1 - a_2)(b_1 - b_2)$$

Satisfactory results have been obtained with the use of Burr-Brown integrated multiplier circuits Type 4214AP, as to which the gain factor K is 0.1, corresponding to a loss factor of 10.

In the first channel 20, only the multiplier inputs $60a_1$ and $60b_1$ are actively used. The other inputs $60a_2$ and $60b_2$ are grounded so that such inputs are always at zero voltage. Thus, the multiplier 60 performs multiplication in accordance with the following simplified relation:

$$e_0 = K a_1 b_1$$

The multiplier inputs $60a_1$ and $60b_1$ are supplied with the cos x and sin x signals, so that these signals are multiplied by the multiplier 60. These two inputs could be interchanged. A gain of 2 is also introduced into the first channel 20, so that the output of the multiplier 60 is multiplied by a factor of 2. In this case, the gain of 2 is provided by the amplifier 68, which handles the sin x signal. Thus, the amplifier 68 supplies a signal corresponding to 2 sin x to the multiplier input $60b_1$. Alternatively, the amplifier 68 could be employed to handle the cos x signal, or could be connected to handle the output of the multiplier 60. Thus, the gain of 2 can be provided anywhere in the first channel 20.

In the second channel 22, all four multiplier inputs are actively used. The multiplier inputs $62a_1$ and $62a_2$, constituting the first differential pair, are supplied with the cos x and −sin x signals. The phase inverter 86 produces the $-\sin x$ signal. The multiplier inputs $62b_1$ and $62b_2$, constituting the second differential pair, are supplied with the cos x and sin x signals.

Thus, the second multiplier 62 multiplies the quantity (cos x + sin x) times the quantity (cos x − sin x), resulting in an output which is proportional to cos 2x.

By adjusting the gain control 40, the outputs sin 2x and cos 2x can be balanced so as to be exactly equal in magnitude. By adjusting the d.c. offset controls 42 and 44, any d.c. offset in the input signals sin x and cos x can be eliminated, so that the multiplying operations will not be affected by such zero offsets.

The frequency multiplying circuit 10 is capable of producing the double frequency outputs sin 2x and cos 2x with low distortion and good sinusoidal waveform. This advantage makes it possible to connect two or more of the multiplying circuits in cascade, to produce higher orders of frequency multiplication. For example, two of the multiplying circuits may be connected in cascade to produce two successive frequency multiplications by the factor of 2, so that output signals sin 4x and cos 4x will be produced. Three multiplying circuits can be connected in cascade to provide three successive frequency multiplications by a factor of 2, so that output signals sin 8x and cos 8x will be produced.

The multiplying circuit of the present invention may be employed in conjunction with an optical encode to produce additional outputs of a higher order. To cite one specific example, the frequency multiplying circuit may be employed in connection with an optical encoder having outputs to produce a twelve bit binary word, having digits corresponding to $2^0$ through $2^{11}$, plus sine and cosine outputs of the next higher order, which may be represented as $\sin 2^{12}x$ and $\cos 2^{12}x$. Such sine and cosine signals may be supplied to the input of the frequency multiplying circuit of the present invention. Such frequency multiplying circuit will produce sine and cosine signals of the next higher order. Such higher order signals may be represented as $\sin 2^{13}x$ and $\cos 2^{13}x$.

If a second frequency multiplying circuit is cascaded with the first circuit, the second circuit will produce another higher order of sine and cosine signals, which may be represented as $\sin 2^{14}x$ and $\cos 2^{14}x$.

In theory, any desired number of multiplying circuits can be cascaded successively, but a practical limit results from the small amount of distortion and the minor d.c. offsets which are inevitably produced by the multiplying circuits. For best results, it is believed that the number of successive cascaded multiplying circuits should be limited to two or three stages.

The high order sine and cosine signals produced by the present invention can readily be converted into Gray code or natural binary signals, if desired, by proper gating circuits.

The frequency multiplying circuits of the present invention can be employed in cascade with other types of circuits for synthesizing higher order signals. For example, tow stages of the frequency multiplying circuit can be followed by a phase splitting circuit. Starting with sin x and cos x signals, the frequency multiplying circuits will produce sin 2x, cos 2x, sin 4x and cos 4x signals, which can be digitized to provide two corresponding binary bits. The phase splitting circuit will produce two more binary bits. Thus, starting with a 12 bit encoder output, for example, the total number of bits can be increased to 16.

For the assistance of those skilled in the art, the drawings show various component values which have been found to be satisfactory. The various operational amplifiers 32, 34, 70 and 88 may be provided by commercially available integrated circuits, Type LM324AN. However, those skilled in the art will be able to assign other satisfactory component values and type designations. The present invention is not to be limited to any particular component values or type designations. Moreover, other modifications, alternative constructions and equivalents may be employed, without departing from the true spirit and scope of the present invention.

I claim:

1. A frequency multiplying electrical circuit for producing double frequency sine and cosine output signals sin 2x and cos 2x from sine and cosine input signals sin x and cos x, comprising sine input means and cosine input means for supplying the sin x and cos x input signals;

first and second multiplier circuits, each multiplier circuit having an output $e_o$ and four inputs $a_1$, $a_2$, $b_1$ and $b_2$ and being adapted to perform multiplication in accordance with the following relation:

$$e_o = K(a_1 - a_2)(b_1 - b_2);$$

means connected between said cosine input means and said $a_1$ input of said first multiplier circuit for supplying the cos x input signal to said $a_1$ input thereof;

means including an amplifier having a gain of two connected between said sine input means and said $b_1$ input of said first multiplier circuit for supplying a 2 sin x signal to said $b_1$ input of said first multiplier circuit, means for supplying zero input to said $a_2$ and $b_2$ inputs of said first multiplier circuit;

means connected between said cosine input means and said $a_1$ and $b_1$ inputs of said second multiplier circuit for supplying the cos x input signal to said $a_1$ and $b_1$ inputs of said second multiplier circuit;

means including a phase inverter connected between said sine input means and said $a_2$ input of said second multiplier circuit for supplying a negative sin x input to said $a_2$ input of said second multiplier circuit;

and means connected between said sine input means and said $b_2$ input of said second multiplier circuit for supplying the sin x input signal to said $b_2$ input of said second multiplier circuit, whereby said first multiplier circuit develops an output proportional to sin 2x, while said second multiplier circuit develops an output proportional to cos 2x.

2. A circuit according to claim 1, in which said sine input means and said cosine input means include respective input amplifiers for supplying the sin x and cos x input signals in amplifier form.

3. A circuit according to claim 2, including means for adjusting the relative gain of said sine input and cosine input amplifiers.

4. A circuit according to claim 2, in which said input amplifiers include direct current offset adjusting means.

5. A frequency multiplying electrical circuit for producing double frequency sine and cosine output signals sin 2x and cos 2x from sine and cosine input signals sin x and cos x, comprising sine input means and cosine input means for supplying the sin x and cos x input signals;

a first channel including a first multiplier circuit having an output $e_0$ and inputs $a_1$ and $b_1$ and being adapted to perform multiplication in accordance with the following relation:

$$e_0 = K a_1 b_1;$$

said first channel including means connected between said cosine input means and said $a_1$ input of said first multiplier circuit for supplying the cos x input signal thereto;

said first channel including means connected between said sine input means and said $b_1$ input of said first multiplier circuit for supplying a sin x signal thereto;

a second channel including a second multiplier circuit having an output $e_0$ and four inputs $a_1$, $a_2$, $b_1$ and $b_2$ and being adapted to perform multiplication in accordance with the following relation:

$$e_0 = K(a_1 - a_2)(b_1 - b_2);$$

said second channel including means connected between said cosine input means and said $a_1$ and $b_1$ inputs of said second multiplier circuit for supplying the cos x input signal to said $a_1$ and $b_1$ inputs of said second multiplier circuit;

said second channel including phase inverting means connected between said sine input means and said $a_2$ input of said second multiplier circuit for supplying a negative sin x input to said $a_2$ input of said second multiplier circuit;

said second channel including means connected between said sine input means and said $b_2$ input of said second multiplier circuit for supplying the sin x input signal to said $b_2$ input of said second multiplier circuit;

and means affording a gain of two in said first channel relative to said second channel, whereby said first channel develops an output proportional to sin 2x, while said second channel develops an output proportional to cos 2x.

6. A circuit according to claim 5, including an amplifier in said first channel and affording said gain of two.

7. A circuit according to claim 5, in which said sine input means and said cosine input means comprise respective input amplifiers for supplying the sin x and cos x signals in amplifier form.

8. A circuit according to claim 7, including means for adjusting the relative gain of said input amplifiers.

9. An electrical circuit according to claim 7, in which said input amplifiers include direct current offset adjusting means.

10. A circuit according to claim 5, including gain adjusting means for adjusting the amplitude of said sin 2x and cos 2x outputs in relation to said sin x and cos x inputs.

* * * * *

UNITED STATES PATENT AND TRADEMARK OFFICE
CERTIFICATE OF CORRECTION

PATENT NO. : No. 4,359,688
DATED : November 16, 1982
INVENTOR(S) : George D. Haville It is certified that error appears in the above-identified patent and that said Letters Patent are hereby corrected as shown below:

Column 5, line 27, "encode" should be -- encoder --

Column 6, line 60, "amplifier" should be -- amplified --

Column 8, line 21, "amplifier" should be -- amplified --

Signed and Sealed this

Twenty-fourth Day of May 1983

[SEAL]

Attest:

DONALD J. QUIGG

*Attesting Officer*  *Acting Commissioner of Patents and Trademarks*